United States Patent
Li et al.

(10) Patent No.: US 10,043,942 B2
(45) Date of Patent: Aug. 7, 2018

(54) VERTICAL MULTI-JUNCTION LIGHT EMITTING DIODE

(71) Applicant: Luminus Devices, Inc., Sunnyvale, CA (US)

(72) Inventors: Ting Li, Dublin, CA (US); Thomas Yuan, Ventura, CA (US)

(73) Assignee: Luminus Devices, Inc., Woburn, MA (US)

( * ) Notice: Subject to any disclaimer, the term of this patent is extended or adjusted under 35 U.S.C. 154(b) by 570 days.

(21) Appl. No.: 14/514,158

(22) Filed: Oct. 14, 2014

(65) Prior Publication Data

US 2015/0137150 A1    May 21, 2015

Related U.S. Application Data

(60) Provisional application No. 61/892,181, filed on Oct. 17, 2013.

(51) Int. Cl.
| | | |
|---|---|---|
| *H01L 33/08* | (2010.01) | |
| *H01L 33/00* | (2010.01) | |
| *H01L 33/32* | (2010.01) | |
| H01L 33/42 | (2010.01) | |
| H01L 25/075 | (2006.01) | |

(52) U.S. Cl.
CPC .......... *H01L 33/08* (2013.01); *H01L 33/0079* (2013.01); *H01L 33/32* (2013.01); *H01L 25/0756* (2013.01); *H01L 33/42* (2013.01); *H01L 2924/0002* (2013.01)

(58) Field of Classification Search
CPC ...... H01L 33/0079; H01L 33/08; H01L 33/32
See application file for complete search history.

(56) References Cited

U.S. PATENT DOCUMENTS

| | | | |
|---|---|---|---|
| 2002/0048729 A1* | 4/2002 | Nishikawa | G02B 3/0018 430/321 |
| 2005/0082556 A1* | 4/2005 | Sung et al. | 257/96 |
| 2005/0087758 A1* | 4/2005 | Kwak et al. | 257/99 |
| 2006/0035087 A1* | 2/2006 | Yadav et al. | 428/411.1 |
| 2007/0072772 A1* | 3/2007 | Sakizadeh | G03C 1/49872 503/212 |
| 2009/0309120 A1* | 12/2009 | Heidborn et al. | 257/99 |
| 2010/0059776 A1* | 3/2010 | Barnes | B82Y 20/00 257/98 |
| 2013/0000952 A1* | 1/2013 | Srinivas | H01B 1/02 174/126.1 |

* cited by examiner

*Primary Examiner* — Michael Carter
(74) *Attorney, Agent, or Firm* — Wolf, Greenfield & Sacks, P.C.

(57) ABSTRACT

An embodiment of the invention comprises a first III-V semiconductor structure including a first light emitting layer disposed between a first n-type region and a first p-type region, and a second III-V semiconductor structure including a second light emitting layer disposed between a second n-type region and a second p-type region. A first contact is formed on a top surface of the first III-V semiconductor structure. A second contact is formed on a bottom surface of the second III-V semiconductor structure. A bonding structure is disposed between the first and second III-V semiconductor structures.

20 Claims, 1 Drawing Sheet

VERTICAL MULTI-JUNCTION LIGHT EMITTING DIODE

CROSS-REFERENCE TO RELATED APPLICATIONS

This application claims priority to U.S. provisional application Ser. No. 61/892,181, by Ting Li et al. filed on Oct. 17, 2013, and is incorporated herein by reference.

BACKGROUND

Description of Related Art

A semiconductor light emitting diode (LED) is a semiconductor p-n junction that emits light when forward biased. When an LED is forward biased, electrons generated in an n-type region combine with holes generated in a p-type region, releasing energy in the form of photons. The energy of the emitted photons is dictated by the energy band gap of the semiconductor, and determines the wavelength and therefore the color of the emitted light. LEDs are often formed of III-V materials such as binary, ternary, and quaternary alloys of aluminum, indium, gallium, arsenic, phosphorus, and nitrogen. UV- and blue-emitting LEDs are often formed of III-nitride materials.

It is desirable to increase the drive current in LEDs in order to produce more photons. However, the internal quantum efficiency, defined as photons produced per current injected, of current III-nitride LEDs may drop at high current density. LEDs operated at high current density may also generate heat sufficient to reduce the efficiency of the device. LEDs may also suffer reliability problems when operated under high drive current.

SUMMARY

In embodiments of the invention, multiple LED junctions are stacked in a vertical device, which may reduce the current density in each LED to achieve the desired optical output per unit emitting area.

An embodiment of the invention comprises a first III-V semiconductor structure including a first light emitting layer disposed between a first n-type region and a first p-type region, and a second III-V semiconductor structure including a second light emitting layer disposed between a second n-type region and a second p-type region. A first contact is formed on a top surface of the first III-V semiconductor structure. A second contact is formed on a bottom surface of the second III-V semiconductor structure. A bonding structure is disposed between the first and second III-V semiconductor structures. In some embodiments, more than two III-V semiconductor structures may be bonded together.

DETAILED DESCRIPTION

Figure 1:
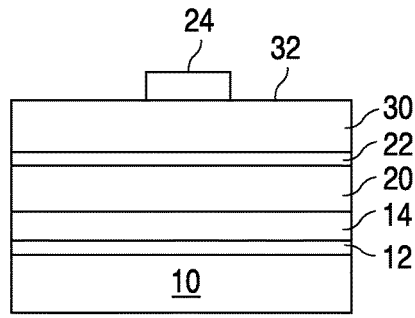
FIG. 1 illustrates a vertical multi-junction light emitting diode according to embodiments of the invention.
Figure 7:
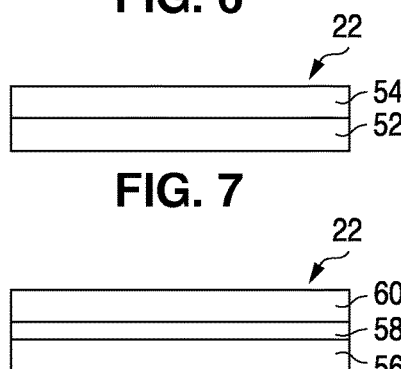
FIGS. 7 and 8 illustrate examples of bonding structures.
Figure 8:
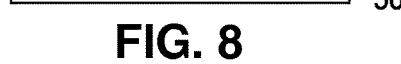

FIG. 1 illustrates a vertical multi-junction LED according to embodiments of the invention. In the device of FIG. 1, a first LED 20 and a second LED 30 are stacked on a carrier 10. The first LED 20 is attached to the carrier through conductive structure 14 and bonding structure 12. Any suitable bonding structure 12 may be used including, for example, one or more layers of AuSn, CuSn, Au, and In, as described below. The second LED 30 is attached to the first LED 20 through bonding structure 22. Bonding structure 22 is electrically conductive. Two examples of bonding structures 22 are illustrated in FIGS. 7 and 8. A top contact 24 such as, for example, a thick metal bonding pad electrically connected to current spreading metal "fingers," a thin metal web, or other suitable structure for spreading current in the device, a transparent conductive layer such as ITO, or other light-transmitting and conductive structure, is formed on the top surface 32 of the structure. A bottom contact (not shown) is formed on carrier 10. When forward biased, current is injected into the first and second LEDs 20 and 30 through top contact 24 and carrier 10, such that the light emitting regions of first and second LEDs 20 and 30 emit light. The current density in each of the light emitting regions may be kept low. A surface of conductive structure 14 in contact with first LED 20 may be reflective, such that emitted light is directed toward the top surface 32 and the side surfaces of the structure, where the light may be extracted from the structure.

Though two LEDs (two junctions) are illustrated in the device of FIG. 1, more LEDs may be added. For example, prior to adding top contact 24, one or more additional LEDs may be added to the structure illustrated in FIG. 1, for example by the process illustrated in FIGS. 5 and 6 or by any other suitable process. The invention is not limited to a device with two LEDs.

The device illustrated in FIG. 1 may be formed by the process illustrated in FIGS. 2, 3, 4, 5, and 6, or any other suitable process. In each of FIGS. 2, 3, 4, 5, and 6, a single device is illustrated. However, it is to be understood that the process illustrated in FIGS. 2, 3, 4, 5, and 6 may take place on a wafer scale, where a wafer of devices is created, then individual devices or groups of devices are cut or otherwise separated from the wafer. Photolithography and etching may be used to define individual devices on the wafers, as is known in the art.

Figure 2:
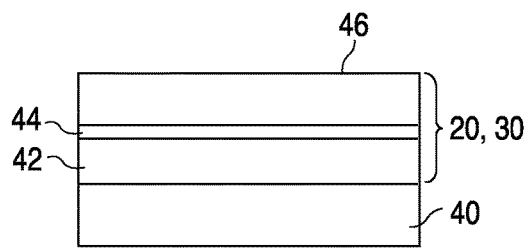
FIG. 2 illustrates a semiconductor structure of a single junction, grown on a growth substrate.

In FIG. 2, a semiconductor structure 20, 30 is grown on a growth substrate 40, as is known in the art. The growth substrate 40 may be, for example, sapphire, SiC, GaN, Si, GaAs, or any other suitable substrate. Semiconductor structure 20, 30 may be grown by, for example, an epitaxial technique, metal organic chemical vapor deposition, vapor phase epitaxy, molecular beam epitaxy, or any other suitable technique. Semiconductor structure 20, 30 may be grown on one or more nucleation layers, preparation layers, and/or buffer layers (not shown in FIG. 2) which prepare the surface of the substrate 40 for growth of the high quality layers in semiconductor structure 20, 30.

Semiconductor structure 20, 30 includes a light emitting or active region 44 sandwiched between an n-type region 42 and a p-type region 46. The n-type region 42 is grown first over the substrate 40 and any preparation layers that may be formed on the substrate. The n-type region 42 may be doped with any suitable dopant including, for example, Si. The n-type region 42 may be a single layer or may include multiple layers of the same or different composition and the same or different dopant concentration. The n-type region 42 may include, for example, layers that spread current, layers that influence the behavior of charge carriers such as electrons and/or holes, layers that influence the behavior of light, and layers that facilitate growth of the active region. The n-type region 42 may include layers that are not intentionally doped.

The light emitting region 44 is grown over the n-type region 42. The light emitting region may include a single light emitting layer or multiple light emitting layers such as, for example, quantum wells, which may be separated by barrier layers. Any suitable light emitting region 44 may be included in the semiconductor structure. The light emitting layers may be, for example, InGaN or InGaP, and may emit visible light, or may be GaN, InGaN, or AlGaN, and may emit UV light. The light emitting layers in LEDs 20 and 30 may emit the same peak wavelength and/or the same color of light, though this is not required.

The p-type region 46 is grown over the light emitting region 44. The p-type region 46 may be doped with any suitable dopant including, for example, Mg. The p-type region 46 may be a single layer or may include multiple layers of the same or different composition and the same or different dopant concentration. The p-type region 46 may include for example, layers that spread current, layers that influence the behavior of charge carriers such as electrons and/or holes, layers that influence the behavior of light, and layers that facilitate formation of a metal or other contact on the p-type region 46. The p-type region 46 may include layers that are not intentionally doped.

The semiconductor structure may be patterned, for example to form a current blocking layer in the p-type region 46 where the top contact 24 will later be formed, and/or to form individual devices or structures on a device, and/or to facilitate light extraction, as is known in the art.

Figure 3:
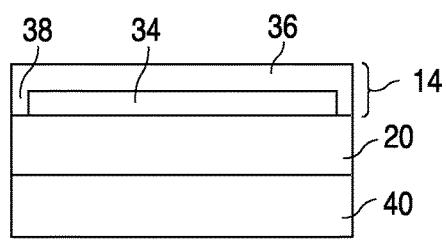
FIG. 3 illustrates a contact formed on the structure illustrated in FIG. 2.

In FIG. 3, a contact 14 is formed on the top surface of the p-type region 46 of the semiconductor structure 20. The contact 14 may be any suitable structure. The contact 14 is used to inject current into the structure through the carrier 10, described below, and is therefore electrically conductive. In the example illustrated in FIG. 3, the contact 14 includes a reflective layer 34, which may be silver, silver and indium tin oxide (ITO), silver and aluminum-doped zinc oxide (AZO) or any other suitable metal or other material. A guard layer 36 is formed over the reflective layer 34. The reflective layer 34 may be patterned before forming the guard layer 36 to remove reflective material near the edges 38 of the device structure, such that the guard layer 36 may encapsulate the reflective layer 34. The guard layer 36 may prevent or reduce damage to the reflective layer 34 caused by, for example, electromigration of the reflective layer 34 and/or wafer bonding or other processing steps. The guard layer 36 may be, for example, platinum, titanium, tungsten, TiW, chrome, nickel, alloys thereof, or any other suitable metal or other material. The structure may be optionally annealed, for example after semiconductor growth, after forming the reflective layer 34, and/or after forming the guard layer 36.

Figure 4:
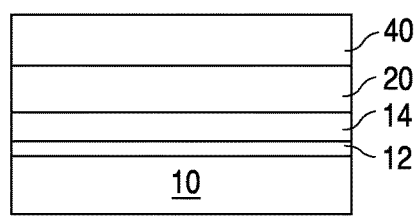
FIG. 4 illustrates the structure of FIG. 3 attached to a carrier.

In FIG. 4, the structure of FIG. 3 is attached to carrier 10. Carrier 10 may be, for example, Si, CuW, ceramic, or any other suitable material. In some embodiments, carrier 10 is conductive. In some embodiments, carrier 10 includes an insulating body, and one or more conductive contacts formed on or within carrier 10 electrically connect to bonding layer 12 to forward bias LED 20. As illustrated in FIG. 4, the LED 20 is flipped relative to the growth direction, such that the p-type region 46 is closest to the carrier 10.

One or more bonding layers 12 are formed between the LED 20 and the carrier 10. For example, a AuSn, CuSn, Au, In, or any other suitable bonding layer may be formed on contact 14 on the device of FIG. 3. A AuSn, CuSn, Au, In, or any other suitable bonding layer may be formed on carrier 10. The carrier wafer and device wafer are then bonded together, for example, by pressing the wafers together. The wafers may be heated during bonding, for example to a temperature of at least 200° C. in some embodiments and no more than 660° C. in some embodiments.

Figure 5:
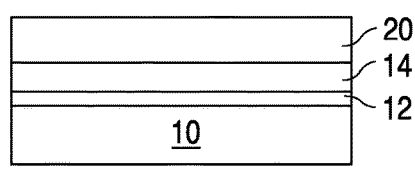
FIG. 5 illustrates the structure of FIG. 4 after removing the growth substrate.

In FIG. 5, the growth substrate 40 is removed from the semiconductor structure of LED 20. The growth substrate may be removed by laser lift off, etching, grinding, mechanical techniques, or any other technique that is suitable to the growth substrate. For example, a sapphire growth substrate may be removed by laser lift off, a combination of etching and laser lift off, a combination of grinding and laser lift off, or any other suitable technique. A silicon growth substrate may be removed by etching or any other suitable technique.

A portion of the semiconductor structure 20 exposed by removing the growth substrate may also be removed. For example, buffer layers, preparation layers, and/or nucleation layers formed before the n-type region 42 or as part of the n-type region 42 may be removed by any suitable technique including, for example, wet or dry etching, mechanical techniques, or chemical mechanical polishing. The surface of the n-type region 42 may be polished by any suitable technique including, for example, mechanical techniques and chemical mechanical polishing.

Figure 6:
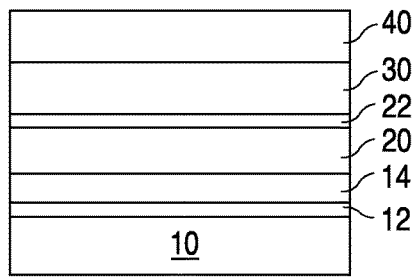
FIG. 6 illustrates a second junction attached to the structure of FIG. 5.

In FIG. 6, a second LED 30 grown on a growth substrate 40, as illustrated in FIG. 2, is attached to the structure of FIG. 5. A bonding structure 22 is disposed between LEDs 20 and 30. As illustrated in FIG. 6, the second LED 30 is flipped relative to the growth direction illustrated in FIG. 2. Accordingly, the p-type region 46 of second LED 30 and the n-type region 42 of first LED 20 are disposed on either side of the bonding structure 22.

Bonding structure 22 may be a single layer of transparent conductive material, such as a thin metal, ITO, or AZO layer, or a multi-layer structure. In some embodiments, all of the layers in the bonding structure are transparent, conductive layers. After bonding, the individual layers in the multi-layer bonding structures illustrated below may form one substantially homogeneous layer, such that the individual layers may be largely indistinguishable. Two examples of multi-layer bonding structures 22 are illustrated in FIGS. 7 and 8.

In one embodiment of a bonding structure 22 illustrated in FIG. 7, two bonding layers 52 and 54 are included. Each of bonding layers 52 and 54 may be, for example metal, ITO, AZO, or any other suitable, transparent conductive material. Bonding layers 52 and 54 may be the same materials or different materials.

Bonding layer 52 may be applied, for example, to the top surface of the n-type region 42 of first LED 20, after removing the growth substrate as illustrated in FIG. 5, and before bonding as illustrated in FIG. 6. The structure including first LED 20 may be optionally annealed after forming bonding layer 52 and before bonding. Bonding layer 54 may be applied, for example, to the top surface of p-type region 46 of LED 30 in the orientation illustrated in FIG. 2 (i.e. before flipping the LED 30 into the orientation illustrated in FIG. 6). The structure including second LED 30 may be optionally annealed after forming bonding layer 54 and before bonding. Bonding layers 52 and 54 may be formed by any suitable technique including, for example, e-beam evaporation or sputtering.

In one embodiment of a bonding structure 22 illustrated in FIG. 8, three bonding layers 56, 58, and 60 are included. Each of bottom bonding layer 56 and top bonding layer 60 may be, for example metal, ITO, AZO, or any other suitable, conductive material. Bonding layers 56 and 60 may be the same materials or different materials. A third bonding layer 58 is disposed between bonding layers 56 and 60. Each layer is kept as thin as possible to minimize light absorption and less than ideal redirection of light.

In some embodiments, bonding layer 58 is a nanoparticle layer. Examples of suitable nanoparticles include nanoparticle ITO, nanoparticle AZO, metal nanowires, or any other suitable material. A nanoparticle bonding layer 58 may be formed by any suitable technique. In some embodiments, the nanoparticles are suspended in a solvent. The suspension is applied uniformly to one or both of bonding layers 56 and 60 using any suitable technique, including, for example, spin coating or a Mayer rod coating technique. The structure is then heated in a vacuum to evaporate or otherwise remove the solvent. After driving off the solvent, the two sides of the structure (i.e. LED 20 and LED 30) are brought into contact on a wafer bonding tool with the nanoparticle layer sandwiched between the two structures. The presence of a nanoparticle layer 58 may reduce the bonding temperature required to form a suitable wafer bond. For example, devices with a bonding structure 22 as illustrated in FIG. 7 may be bonded at a temperature of at least 500° C. in some embodiments and no more than 660° C. in some embodiments. Devices with a bonding structure 22 including a nanoparticle layer 58 as illustrated in FIG. 8 may be bonded at a temperature of at least 400° C. in some embodiments, no more than 660° C. in some embodiments, and no more than 500° C. in some embodiments.

In some embodiments, bonding layer 58 includes nanoparticles disposed in another material. For example, any suitable nanoparticles including, for example, ITO nanoparticles, AZO nanoparticles, a mixture of nanoparticles, metal nanowires, or silver nanowires, are mixed with any suitable material such as a glue, a transparent bonding material, or spin-on-glass (SOG) material through any suitable technique including, for example, ultrasonic agitation and/or orbital mixing. The mixture is then uniformly applied to either layer bonding layer 56, bonding layer 60, or both using any suitable technique including, for example, spinning coating, or Mayer rod coating. The structure with the nanoparticle mixture may then be heated in vacuum to drive off organic solvent, where appropriate (for example when SOG is used). The two sides of the structure (i.e. LED 20 and LED 30) are brought into contact on a wafer bonding tool with the nanoparticle layer 58 sandwiched between the two structures. Bonding temperature may be, for example, at least 300° C. in some embodiments and no more than 550° C. in some embodiments.

Bonding layer 56 may be applied, for example, to the top surface of the n-type region 42 of first LED 20, after removing the growth substrate as illustrated in FIG. 5, and before bonding as illustrated in FIG. 6. The structure including first LED 20 may be optionally annealed after forming bonding layer 56 and before bonding. Bonding layer 60 may be applied, for example, to the top surface of p-type region 46 of LED 30 in the orientation illustrated in FIG. 2 (i.e. before flipping the LED 30 into the orientation illustrated in FIG. 6). The structure including second LED 30 may be annealed after forming bonding layer 60 and before bonding.

The second LED 30 may be bonded to the structure of FIG. 5 by wafer bonding, i.e. by pressing the two wafers together under elevated temperature and pressure. For example, a commercially available wafer bonding tool may be used.

Figure 9:
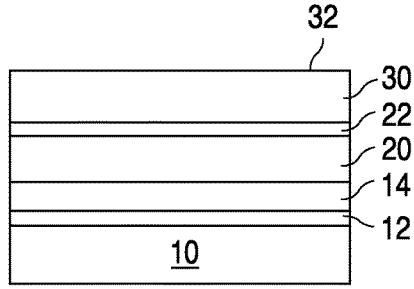
FIG. 9 illustrates the structure of FIG. 6 after removing the growth substrate.

After bonding as illustrated in FIG. 6, the growth substrate 40 of second LED 30 may be removed, as illustrated in FIG. 9. The substrate may be removed, for example as described above in reference to FIG. 5. A portion of the semiconductor structure of LED 30 may be removed, for example as described above in reference to FIG. 5. The top surface 32 of LED 30 may be roughened, patterned, or textured, for example to improve light extraction from the device.

A top contact 24 as illustrated in FIG. 1 is formed on the top surface of LED 30, revealed by removing the growth substrate. The top contact 24 may be any suitable structure.

Figure 10:
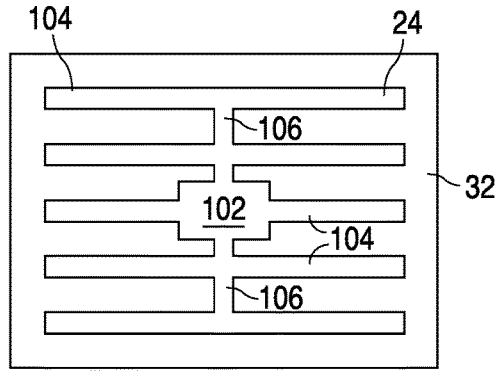
FIG. 10 illustrates a top contact formed on the top surface of the structure of FIG. 9.

FIG. 10 illustrates one example of a top contact 24 formed on the top surface 32 of the structure illustrated in FIG. 9. The contact 24 includes a bond pad 102. The bond pad 102 is located near the center of the surface 32 in FIG. 10, though this is not required: the bond pad 102 may be placed in any suitable location. The bond pad 102 is often metal but may be any suitable conductive material. The bond pad 102 is used to electrically connect the device to another structure by any suitable structure including, for example, a wire bond or metal bridge.

Multiple current spreading "fingers" 104, 106 are electrically connected to bond pad 102, including vertical fingers 106 and horizontal fingers 104. The fingers 104, 106 may be both vertically thinner and horizontally (as illustrated in FIG. 10) thinner than bond pad 102. Fingers 104, 106 are often metal but may be any suitable, conductive material. The horizontal extend of fingers 104, 106 is kept as small as possible when fingers 104, 106 are made of an optically absorbing or reflective material, to minimize the amount of light absorbed or reflected by the fingers.

Including more than one light emitting region in a device, as described above in some embodiments, may have advantages. A device with a single light emitting region requires a current of $I_0$ to output a given optical power. In an ideal device with two light emitting regions, half the current, $I_0/2$, is required to achieve the same optical power output, because both light emitting regions emit light. Accordingly, to achieve a given optical power output, devices according to embodiments of the invention may be operated at reduced current density as compared to devices with a single light emitting region, which may improve the efficiency of the device by reducing or eliminating problems associated with operation at high current density. Though a device with multiple light emitting regions may have a slightly lower light extraction efficiency due to the combined optical absorption in the device structure, this effect may be offset by efficiency gains that may result from operation at reduced current density. Having described the invention in detail, those skilled in the art will appreciate that, given the present disclosure, modifications may be made to the invention without departing from the spirit of the inventive concept described herein. In particular, different features and components of the different devices described herein may be used in any of the other devices, or features and components may be omitted from any of the devices. Therefore, it is not What is being claimed is:

1. A light emitting diode structure comprising:
a first III-V semiconductor structure comprising a first light emitting layer disposed between a first n-type region and a first p-type region;
a second III-V semiconductor structure comprising a second light emitting layer disposed between a second n-type region and a second p-type region;
a first contact formed on a top surface of the first III-V semiconductor structure;
a second contact formed on a bottom surface of the second III-V semiconductor structure; and
a layer of nanoparticles disposed between the first and second III-V semiconductor structures, wherein the first and second III-V semiconductor structures are wafer bonded together using the layer of nanoparticles without any adhesive.

2. The light emitting diode structure of claim 1, wherein a first transparent conductive bonding layer is disposed between the first III-V semiconductor structure and the layer of nanoparticles, and wherein
a second transparent conductive bonding layer is disposed between the second III-V semiconductor structure and the layer of nanoparticles.

3. The light emitting diode structure of claim 2, wherein the first transparent conductive bonding layer is annealed to the first III-V semiconductor structure.

4. The light emitting diode structure of claim 2, wherein one of the first and second bonding layers comprises indium tin oxide.

5. The light emitting diode structure of claim 2, wherein one of the first and second bonding layers comprises aluminum-doped zinc oxide.

6. The light emitting diode structure of claim 1, wherein the nanoparticles are taken from the group consisting of: indium tin oxide nanoparticles, aluminum-doped zinc oxide nanoparticles and silver nanowires.

7. A method comprising:
wafer bonding a first III-V semiconductor structure to a second III-V semiconductor structure under elevated pressure using a nanoparticle layer sandwiched between the first and second III-V semiconductor structures, each of the first and second III-V semiconductor structures comprising a light emitting layer disposed between an n-type region and a p-type region;
forming a first contact on a top surface of the first III-V semiconductor structure; and
forming a second contact on a bottom surface of the second III-V semiconductor structure.

8. The method of claim 7, further comprising:
bonding the first III-V semiconductor structure to a carrier; and
after said bonding the first III-V semiconductor structure to a carrier, removing a growth substrate from the first III-V semiconductor structure.

9. The method of claim 8, further comprising:
after said wafer bonding the first III-V semiconductor structure to the second III-V semiconductor structure, removing a growth substrate from the second III-V semiconductor structure.

10. The method of claim 7, wherein wafer bonding the first III-V semiconductor structure to the second III-V semiconductor structure comprises:
forming a first conductive bonding layer disposed in direct contact with the first III-V semiconductor structure;
forming a second conductive bonding layer disposed in direct contact with the second III-V semiconductor structure; and
pressing the first and second conductive bonding layers together.

11. The method of claim 10, wherein one of the first conductive bonding layer and the second conductive bonding layer comprises indium tin oxide.

12. The method of claim 10, wherein one of the first conductive bonding layer and the second conductive bonding layer comprises aluminum doped zinc oxide.

13. The method of claim 10, wherein the wafer bonding is performed by pressing the first III-V semiconductor structure and the second III-V semiconductor structure together at a temperature of at least 400° C. but no more than 500° C.

14. The method of claim 7, wherein the nanoparticle layer comprises nanowires.

15. The method of claim 7, wherein the wafer bonding is performed without using any adhesive.

16. A light emitting diode structure comprising:
a first III-nitride semiconductor structure comprising a first light emitting layer disposed between a first n-type region and a first p-type region;
a second III-nitride semiconductor structure comprising a second light emitting layer disposed between a second n-type region and a second p-type region; and
a layer of nanoparticles disposed between the first and second III-nitride semiconductor structures, wherein the first III-nitride semiconductor structure is wafer bonded without any adhesive to the second III-nitride semiconductor structure with the layer of nanoparticles sandwiched between the first and second III-nitride semiconductor structures.

17. The light emitting diode structure of claim 16, wherein the layer of nanoparticles comprises silver nanowires.

18. The light emitting diode structure of claim 16, wherein the layer of nanoparticles comprises nanoparticles of indium tin oxide.

19. The light emitting diode structure of claim 16, wherein the layer of nanoparticles is sandwiched between two transparent conductive oxide layers.

20. The light emitting diode structure of claim 19, wherein one of the transparent conductive oxide layers is annealed to the first III-nitride semiconductor structure, and the other of the transparent conductive oxide layers is annealed to the second III-nitride semiconductor structure.

* * * * *